United States Patent
Liao

(10) Patent No.: US 9,173,323 B2
(45) Date of Patent: Oct. 27, 2015

(54) HEAT DISSIPATION ASSEMBLY WITH BIDIRECTIONAL AIRFLOW

(71) Applicant: HON HAI PRECISION INDUSTRY CO., LTD., New Taipei (TW)

(72) Inventor: Feng-Liang Liao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 248 days.

(21) Appl. No.: 13/832,021

(22) Filed: Mar. 15, 2013

(65) Prior Publication Data

US 2014/0211419 A1 Jul. 31, 2014

(30) Foreign Application Priority Data

Jan. 31, 2013 (TW) .................................. 102103697

(51) Int. Cl.
*H05K 7/20* (2006.01)

(52) U.S. Cl.
CPC ........ *H05K 7/20181* (2013.01); *H05K 7/20727* (2013.01)

(58) Field of Classification Search
USPC ........ 361/679.46–679.54, 688–723, 752, 831
See application file for complete search history.

(56) References Cited

U.S. PATENT DOCUMENTS

| | | | |
|---|---|---|---|
| 7,492,592 B2 * | 2/2009 | Ye et al. | 361/695 |
| 7,535,709 B2 * | 5/2009 | Fan et al. | 361/695 |
| 7,554,803 B2 * | 6/2009 | Artman et al. | 361/695 |
| 8,405,983 B2 * | 3/2013 | Chen | 361/690 |
| 8,422,227 B2 * | 4/2013 | Lai | 361/695 |
| 8,720,532 B2 * | 5/2014 | Malone et al. | 165/121 |
| 2002/0145853 A1 * | 10/2002 | Grouell et al. | 361/695 |
| 2003/0224717 A1 * | 12/2003 | Tsai et al. | 454/184 |
| 2006/0291170 A1 | 12/2006 | Hsiao | |
| 2008/0225481 A1 * | 9/2008 | Anderl et al. | 361/695 |

FOREIGN PATENT DOCUMENTS

TW I349072 9/2011

\* cited by examiner

*Primary Examiner* — Courtney Smith
(74) *Attorney, Agent, or Firm* — Novak Druce Connolly Bove + Quigg LLP

(57) ABSTRACT

A heat dissipation assembly is configured in an enclosure of a network device. The enclosure defines an air flue. The heat dissipating assembly includes a fan module received in the air flue, and a damper module secured in one end of the air flue adjacent to the inside of the enclosure. The fan module includes a first bracket and a plurality of fans fixed with the first bracket. The damper module includes a frame and a plurality of vanes located in the frame. When a direction of airflow of the plurality of fans changes, the plurality of fans in the air flue is reversed, and the first bracket supports the plurality of vanes of the damper module to keep the air flue open.

17 Claims, 18 Drawing Sheets

HEAT DISSIPATION ASSEMBLY WITH BIDIRECTIONAL AIRFLOW

BACKGROUND

1. Technical Field

The present disclosure generally relates to heat dissipation assemblies, more particularly to a heat dissipation assembly with bidirectional airflows.

2. Description of Related Art

Most high-grade network devices, such as set-top boxes, routers and servers, are generally mounted on a shelf. Shelves with different structures also require heat dissipation assemblies of the network devices to be different. In order to satisfy configurations of different shelves, a heat dissipation assembly secured in the network device is generally required to provide bidirectional airflow of a fan. For example, one direction of an airflow of the fan flows from an inside of the network device to an outside of the network device, and another direction of an airflow flows from the outside of the network device to the inside of the network device. In order to meet the above requirements, two different fan modules and corresponding different air flues are designed, which unfortunately leads to high cost, due to complexity of constructions of the network device. Furthermore, configuration and upgrade of the network device are limited due to the different fan modules and the different air flues.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
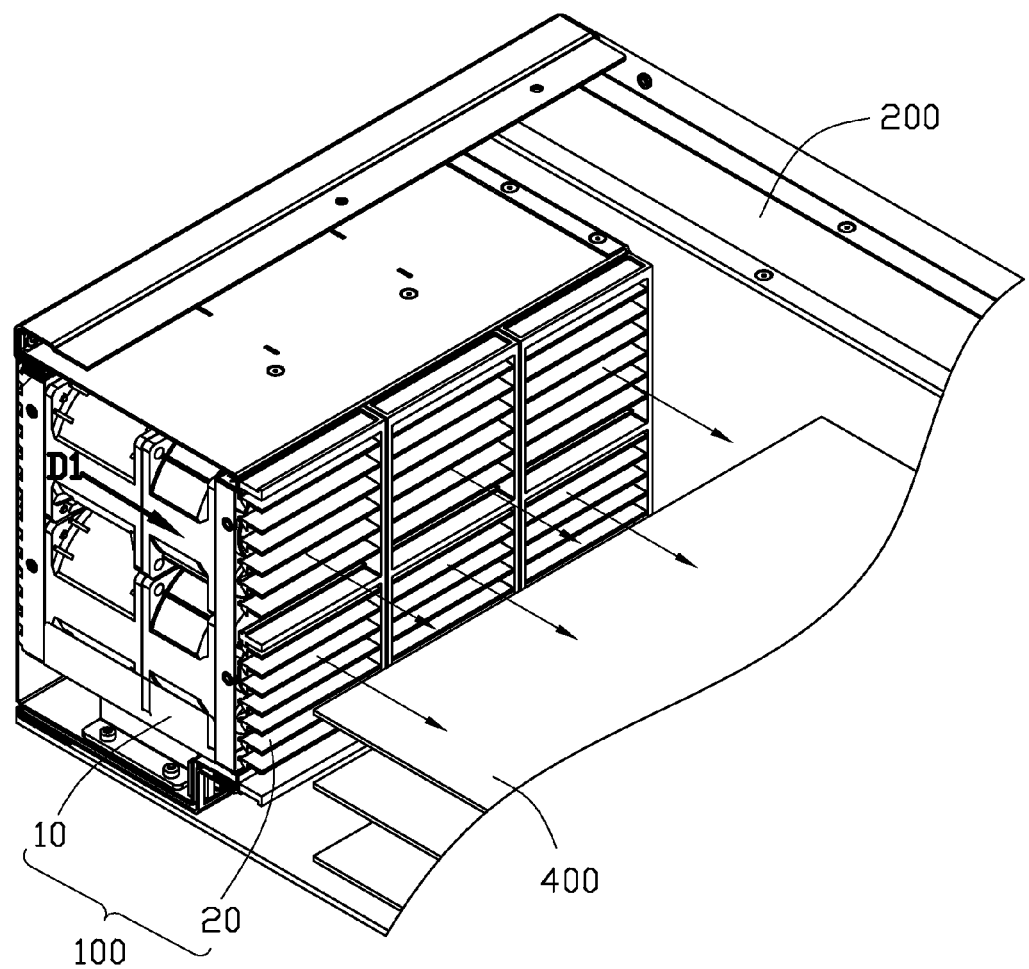
FIG. 1 is a schematic perspective view of a heat dissipation assembly of an exemplary embodiment of the disclosure, wherein the heat dissipation assembly is configured in an enclosure of a network device, and airflow of fans flows from an outside of the enclosure to an inside of the enclosure.
Figure 2:
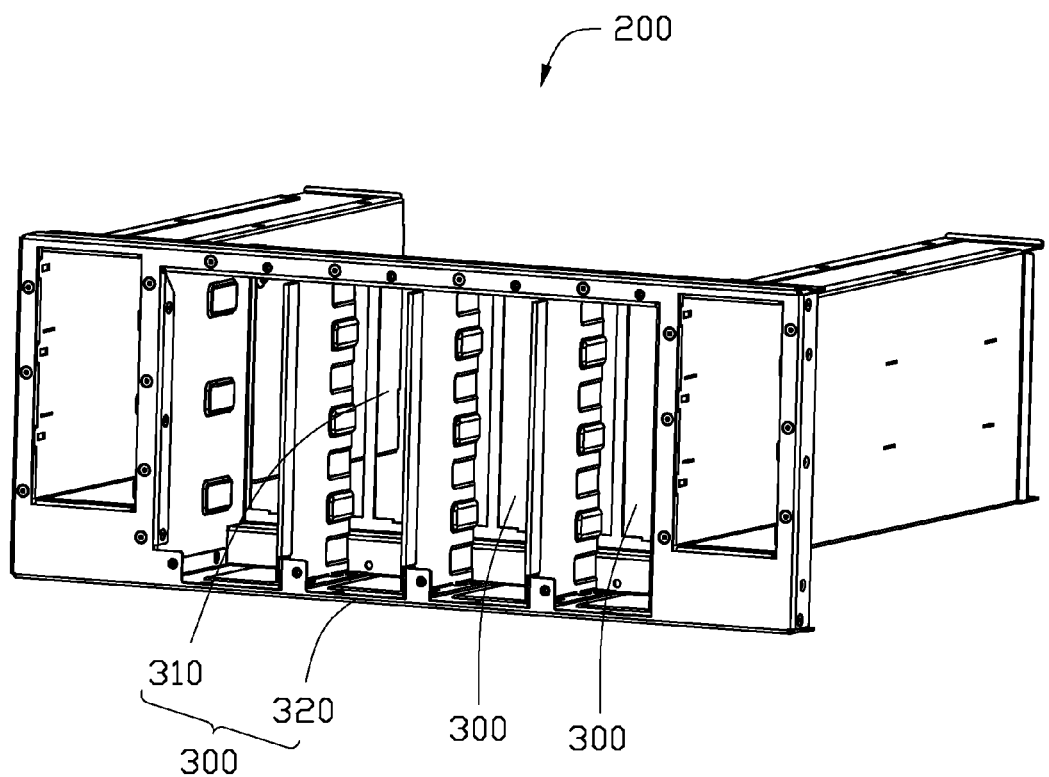
FIG. 2 is a schematic perspective view of the enclosure of the network device.

With reference to FIG. 1 and FIG. 2, a plurality of heat dissipation assemblies 100 are mounted in an enclosure 200 of a network device, and are configured for dissipating heat generated by electronic parts 400 in the enclosure 200. In the embodiment, the network device may be a set-top box. Alternatively, the network device may be a router or a server, but the disclosure is not limited thereto.

The enclosure 200 defines a plurality of air flues 300, and each of the plurality of air flues 300 runs through an inside of the enclosure 200 to an outside of the enclosure 200. Each of the plurality of air flues 300 includes a first end 310 facing inside of the enclosure 200, and a second end 320 adjacent to the outside of the enclosure 200. In the embodiment, the enclosure 200 includes four air flues 300, and the network device correspondingly includes four heat dissipation assemblies 100. Alternatively, quantities of the air flues 300 and the heat dissipation assemblies 100 may be changed according to different requirements.

Each of the plurality of heat dissipation assemblies 100 includes a fan module 10 and a damper module 20. The fan module 10 is received in a corresponding air flue 300 and secured in the enclosure 200, and the damper module 20 is secured in the first end 310 of the corresponding air flue 300 to open or close the corresponding air flue 300.

Figure 3:
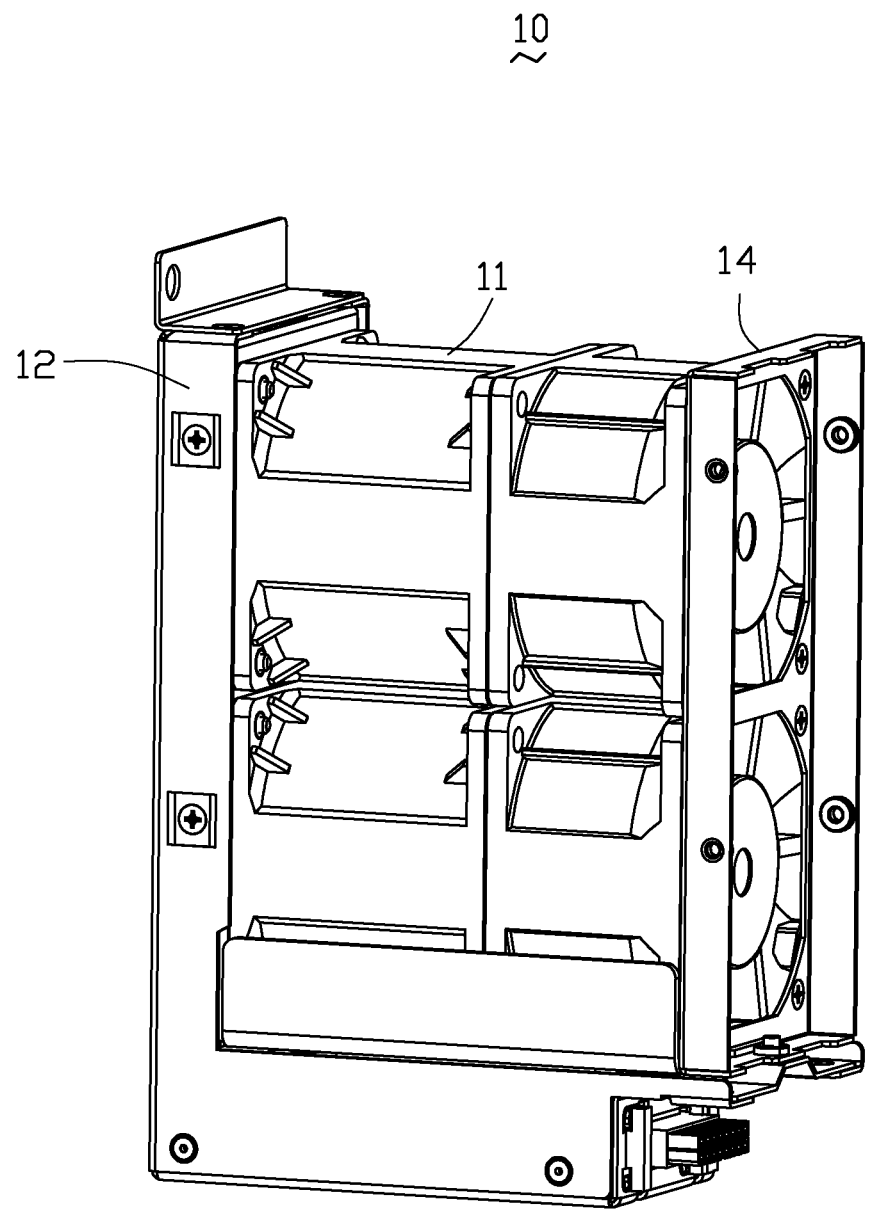
FIG. 3 is a schematic perspective view of a fan module of the heat dissipation assembly of FIG. 1.
Figure 4:
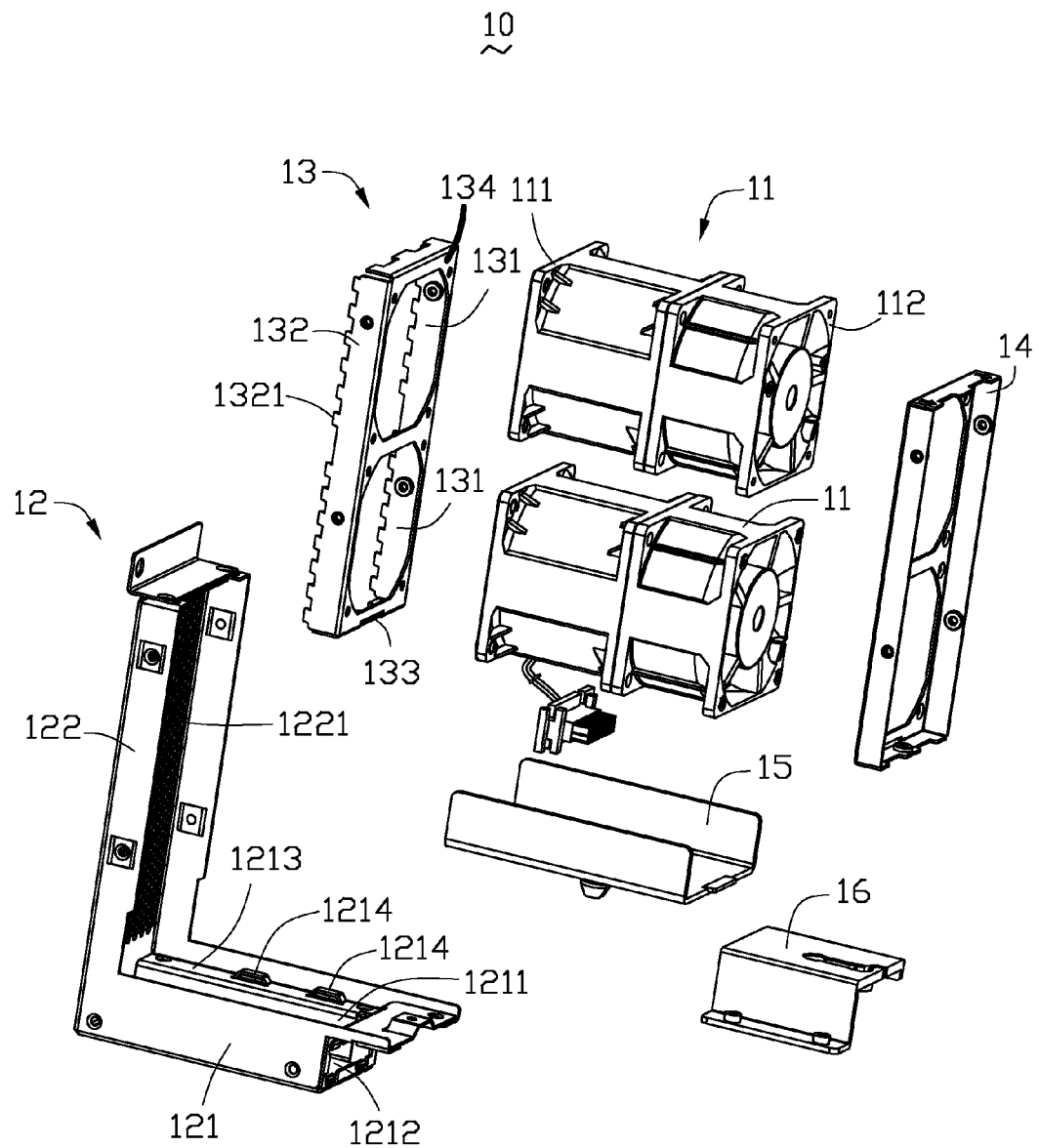
FIG. 4 is an exploded perspective view of the fan module of FIG. 3.

With reference to FIG. 3 and FIG. 4, the fan module 10 includes a plurality of fans 11, a holder 12, a first bracket 13, a second bracket 14, a first board 15 and a second board 16. Each of the plurality of fans 11 includes a first end 111 and a second end 112.

The holder 12 includes a bottom 121 and a sidewall 122 perpendicularly connected with the bottom 121. The bottom 121 defines a receiving space 1211 and a positioning slot 1212 in communication with the receiving space 1211. The receiving space 1211 includes a step 1213 defining a plurality of first latching slot 1214. The sidewall 122 defines a plurality of heat dissipating holes 1221 to dissipate heat in the inside of the enclosure 200 to the outside of the enclosure 200.

The first bracket 13 defines a plurality of hollows 131 corresponding to the plurality of fans 11, and includes a positioning surface 134 surrounding the hollows 131 and a pair of opposite rims 132. Each of the pair of rims 132 extends from a corresponding edge of the positioning surface 134, and includes a plurality of teeth 1321 located in an edge of the rim 132 away from the positioning surface 134. A bottom of the first bracket 13 defines a second latching slot 133.

In the embodiment, the fan module 10 includes two fans 11, and the first bracket 13 defines two hollows 131 correspondingly. Alternatively, quantities of the hollows 131 and the fans 11 may be changed according to different requirements.

A structure of the second bracket 14 is substantially the same as a structure of the first bracket 13, but no teeth 1321 are formed in the second bracket 14. In assembly, the first end 111 of each of the fans 11 is secured in the positioning surface 134 and corresponds to a corresponding hollow 131 of the first bracket 13, the second end 112 of each of the fans 11 is secured in a positioning surface 134 of the second bracket 14 and corresponds to a corresponding hollow 131 of the second bracket 14.

Figure 5:
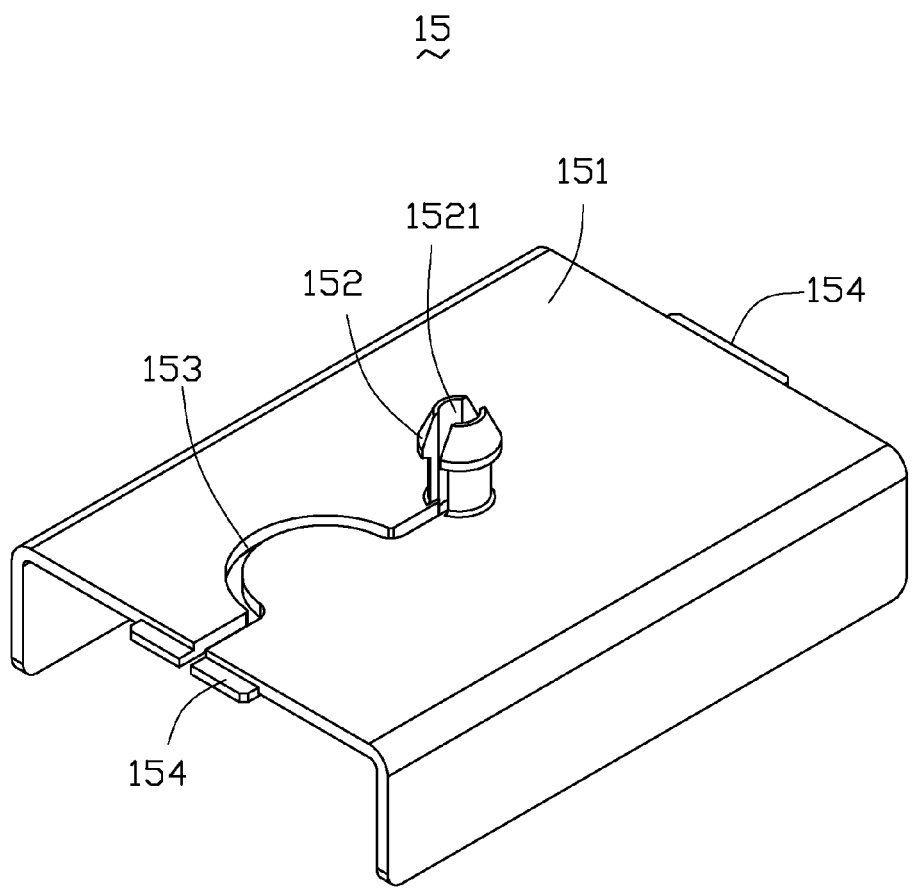
FIG. 5 is a schematic perspective view of a first board of the fan module of FIG. 3.

With reference to FIG. 5, the first board 15 includes a board 151, a shaft 152 perpendicularly extending from the board 151, and a pair of first blocks 154 located on two ends of the board 151, respectively. The board 151 defines a first slot 153, and the shaft 152 defines a through hole 1521. The first slot 153 curvedly extends from one end of the board and toward the shaft 152. The first slot 153 communicates with the through hole 1521 of the shaft 152.

Figure 6:
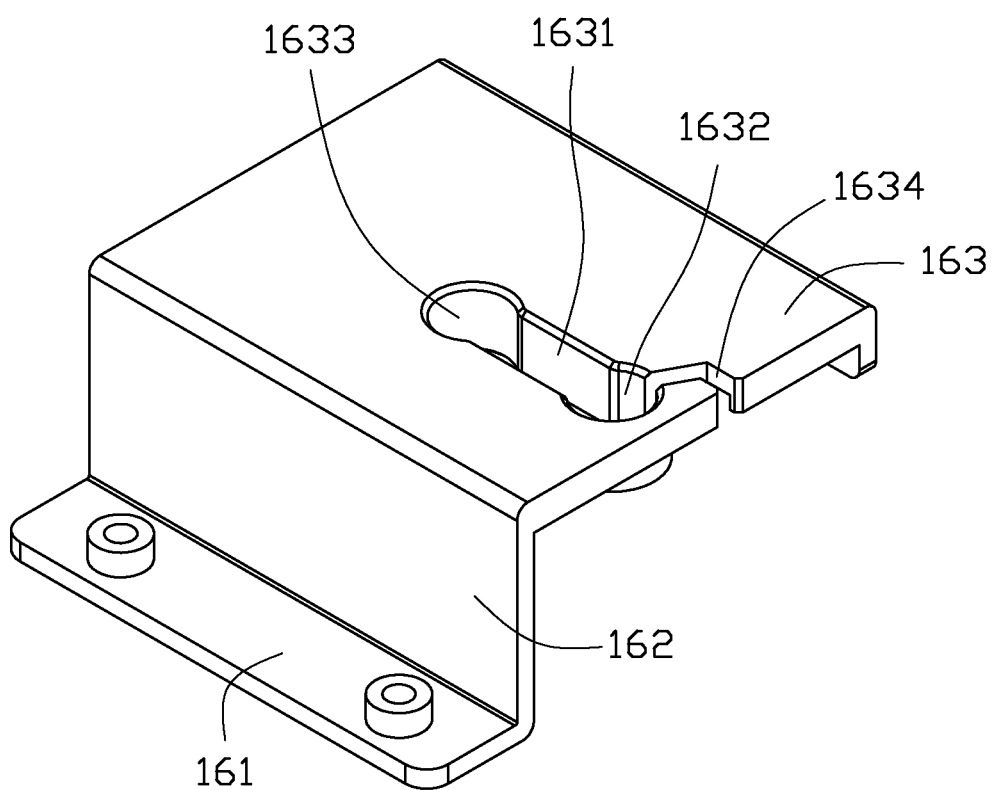
FIG. 6 is a schematic perspective view of a second board of the fan module of FIG. 3.
Figure 7:
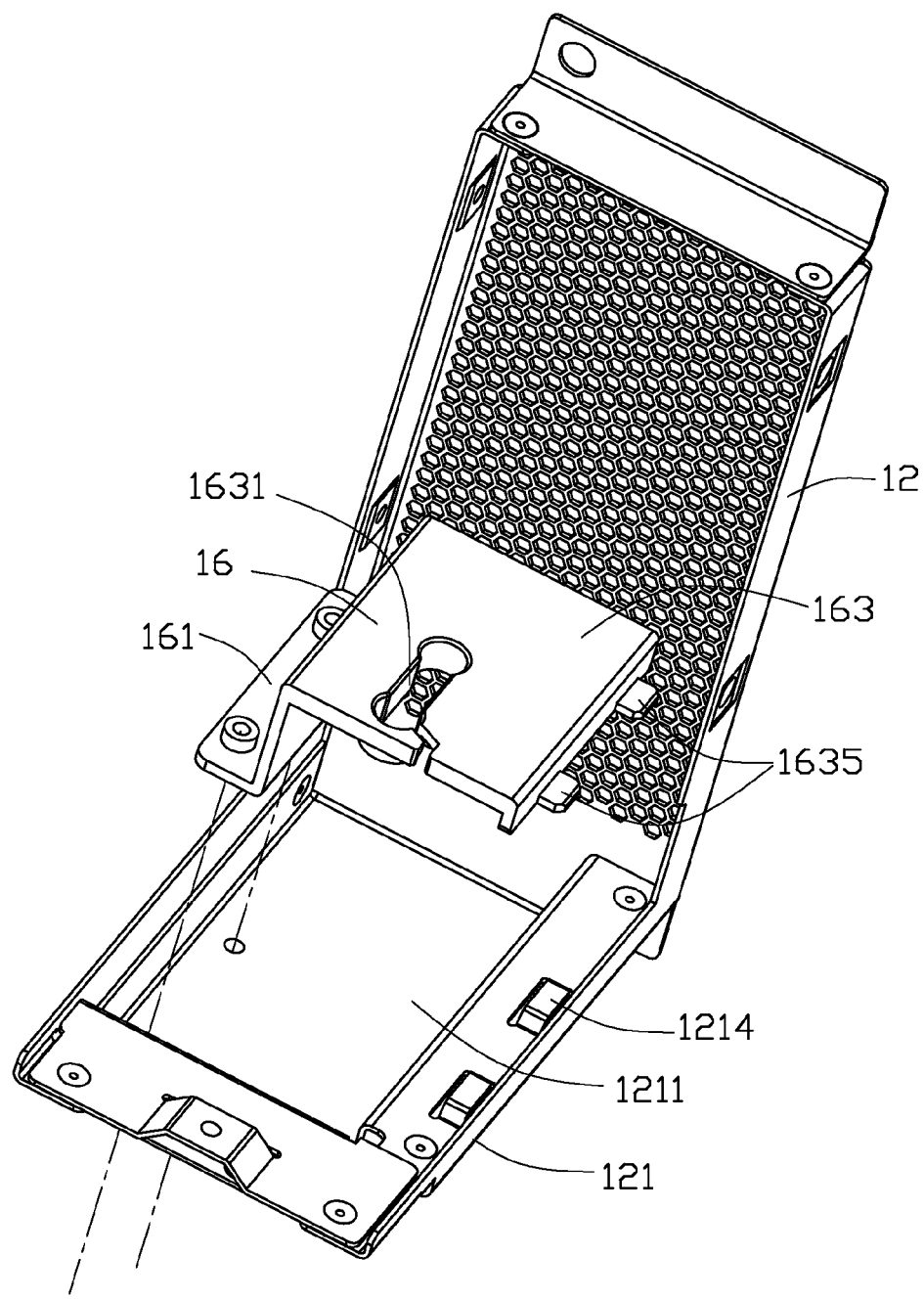
FIG. 7 is an exploded perspective view of the second board and a holder of the fan module of FIG. 3.

With reference to FIG. 6 and FIG. 7, the second board 16 includes a positioning portion 161, a connecting portion 162, a sliding portion 163, and a plurality of second blocks 1635 (referring to FIG. 7) located on one side of the sliding portion 163. Each of the plurality of second blocks 1635 corresponds to one of the plurality of first latching slot 1214 of the holder 12. The connecting portion 162 is perpendicularly connected between the positioning portion 161 and the sliding portion 163. The sliding portion 163 defines a groove 1631, a first receiving hole 1632 in communication with the groove 1631, a second receiving hole 1633 in communication with the groove 1631, and a second slot 1634 in communication with the first receiving hole 1632. The first receiving hole 1632 and the second receiving hole 1633 are located at two ends of the groove 1631, respectively. The second slot 1634 curvedly extends from one edge of the sliding portion and toward to the first receiving hole 1632. In assembly, the second board 16 is received in the receiving space 1211 of the holder 12, the positioning portion 161 of the second board 16 is secured in a bottom of the receiving space 1211. Each of the second blocks 1635 of the second board 16 is latched into a corresponding first latching slot 1214 to secure the second board 16 to the holder 12.

Figure 8:
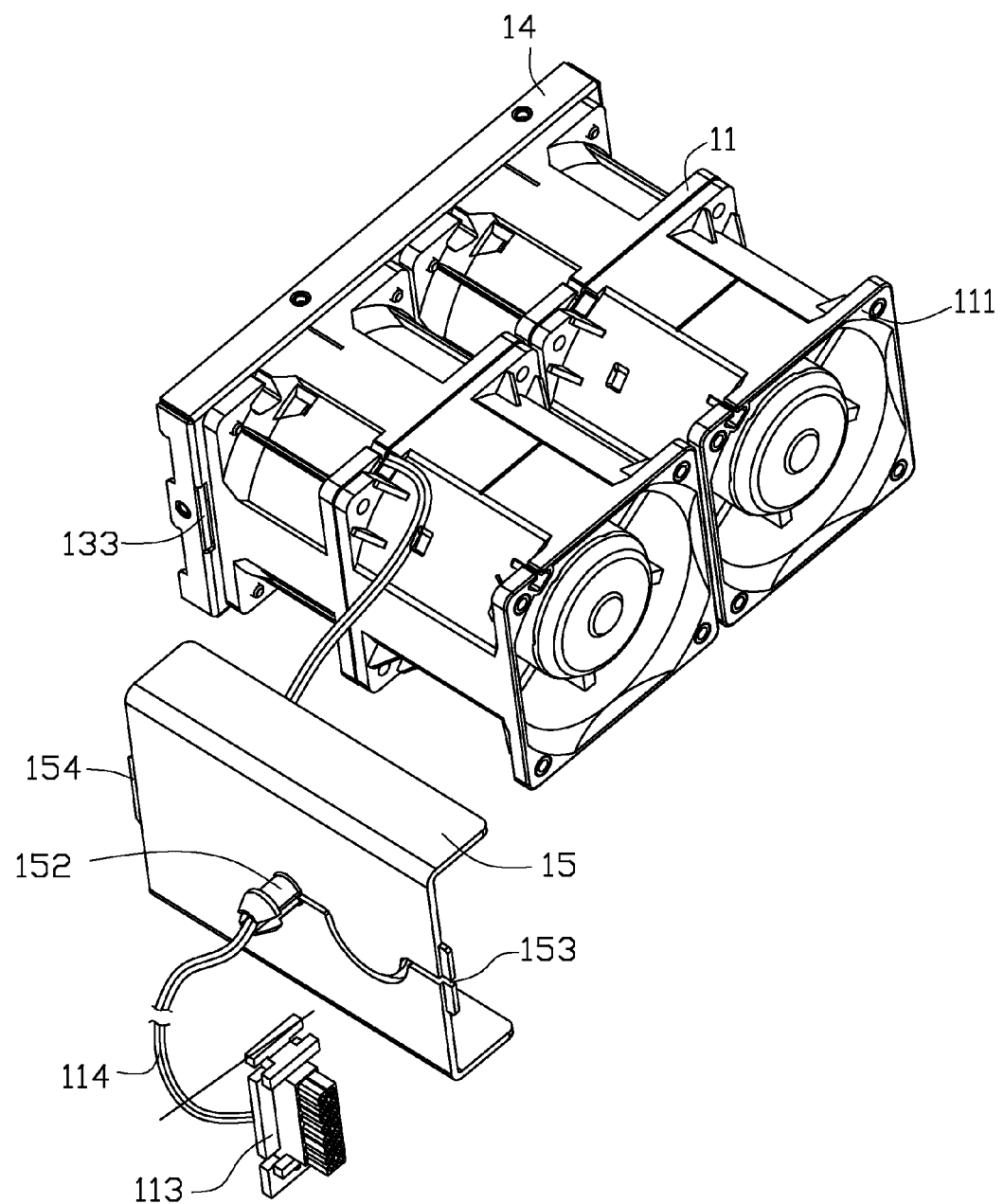
FIG. 8 is a schematic perspective view of a cable of a connector of the fans passing through the first board of FIG. 5.

Referring to FIG. 8, in assembly of the fan module 10, the second end 112 of each of the fans 11 is firstly secured in the second bracket 14 by screws. A cable 114 of a connector 113 of the fans 11 is latched into the first slot 153 of the first board 15, and passes through the through hole 1521 of the shaft 152 along the first slot 153. As a result, the connector 113 of the fans 11 passes through the first board 15. The first block 154 away the first slot 153 of the first board 15 is latched into the second latching slot 133 of the second bracket 14. As a result, one end of the first board 15 is secured in the second bracket 14. Subsequently, the first end 111 of the fans 11 are secured in the positioning surface 134 of the first bracket 13, and the first block 154 of the first board 15 adjacent to the first slot 153 is latched into the second latching slot 133 of the first bracket 13. As a result, the first board 15 is secured in a bottom of the plurality of fans 11.

The fans 11 with the first bracket 13, the second bracket 14 and the first board 15 are combined with the holder 12 with the second board 16 to collectively form the fan module 10.

The cable 114 of the connector 113 of the fans 11 is latched into the second slot 1634 of the second board 16, and the connector 113 is fixed in the positioning slot 1212 of the holder 12. The shaft 152 of the first board 15 is inserted into the groove 1631. The fans 11 are pushed to slide along the groove 1631 and engaged with the holder 12. In this state, the shaft 152 of the first board 15 is received in the second receiving hole 1633 of the second board 16. The first bracket 13 and the second bracket 14 are secured to the holder 12 by screws. As a result, the fan module 10 is assembled, as shown in FIG. 3.

Figure 9:
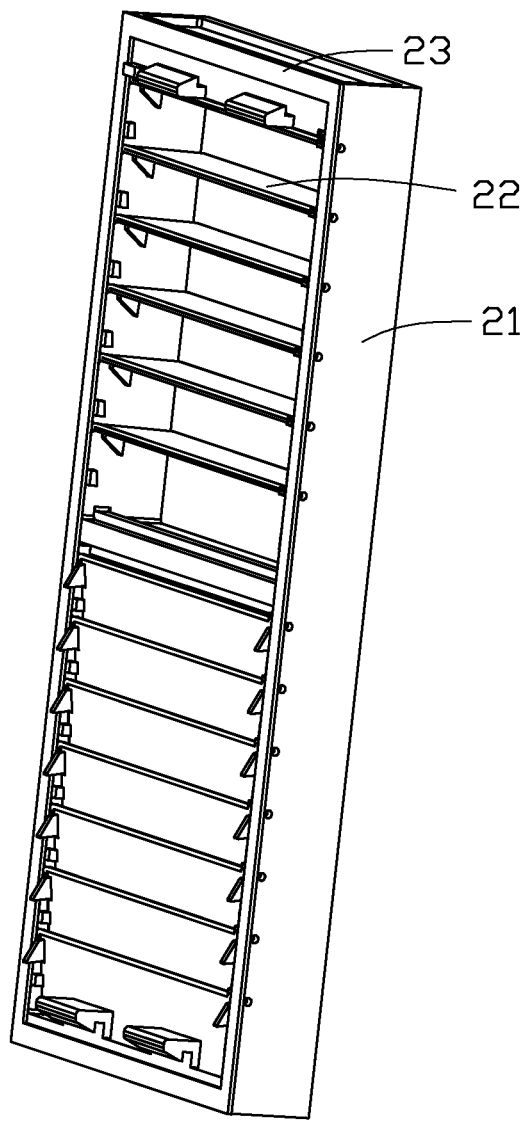
FIG. 9 is a schematic perspective view of a damper module of the heat dissipation assembly of FIG. 1.
Figure 10:
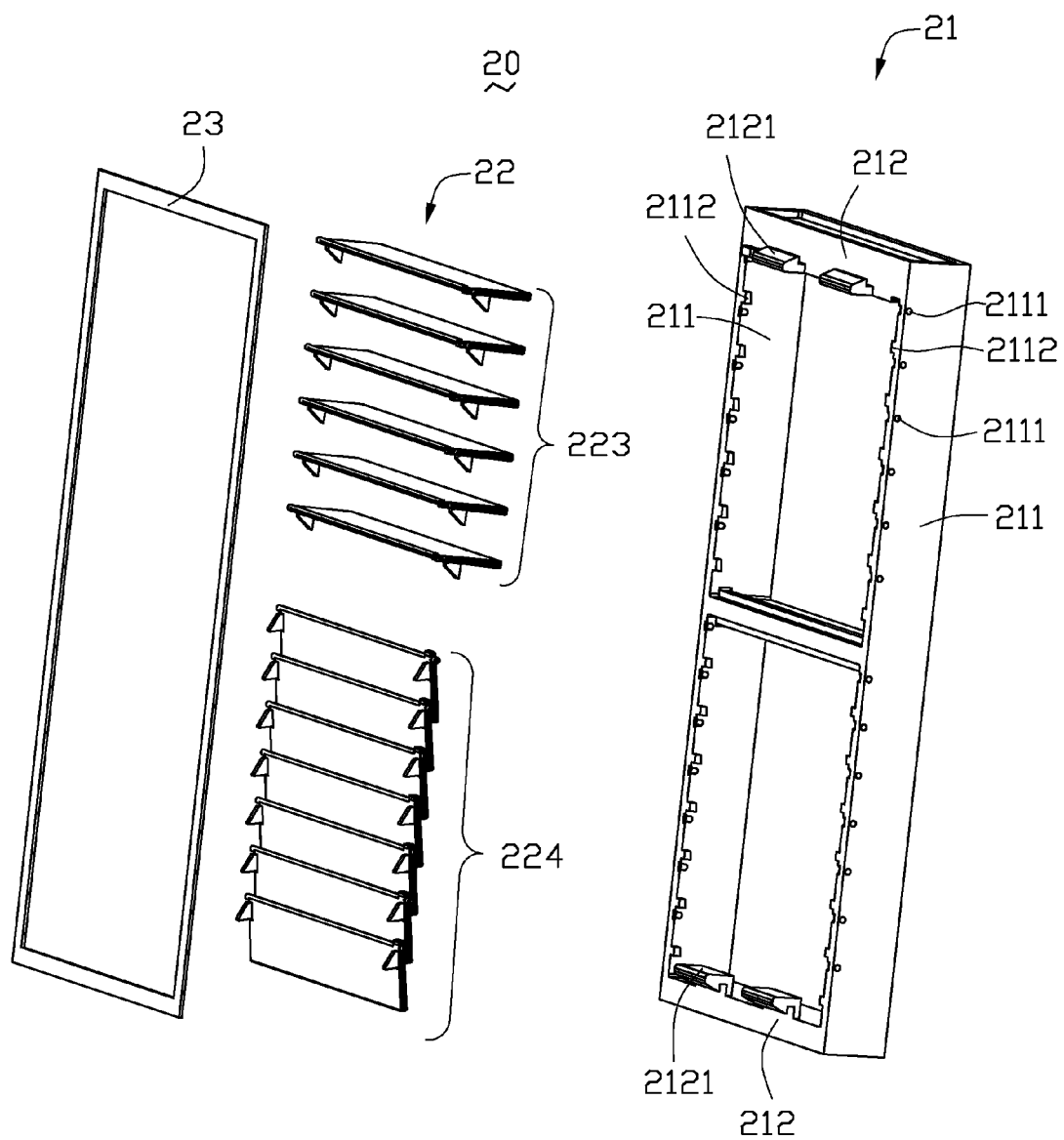
FIG. 10 is an exploded perspective view of the damper module of FIG. 9.

With reference to FIG. 9 and FIG. 10, the damper module 20 includes a frame 21 and a plurality of vanes 22 located in the frame 21 and parallel to each other. The plurality of vanes 22 is configured to rotate relatively to the frame 21.

Figure 11:
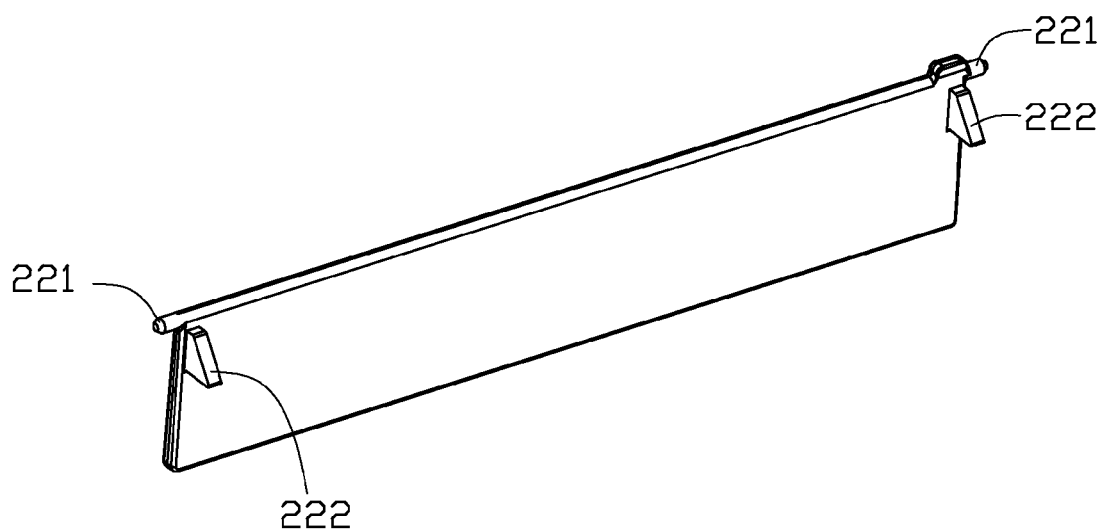
FIG. 11 is a schematic view of a vane of FIG. 9.

With reference to FIG. 11, each of the plurality of vanes 22 includes a pair of posts 221 and a pair of projections 222. The pair of posts 221 is located on two ends of the vane 22, and the pair of the projections 222 project from the vane 22, and are adjacent to the pair of the posts 221, respectively. In the embodiment, each of the projections 222 may be in a shape of a trapezium. Alternatively, each of the projections 222 may be in a shape of a triangle.

The frame 21 includes a pair of opposite first sidewalls 211 and a pair of opposite second sidewalls 212. The first sidewalls 211 define a plurality of pairs of shaft holes 2111. One of each of the plurality of pairs of shaft holes 2111 is located on one of the pair of first sidewall 211, and the other is located on another one of the pair of first sidewalls 211. Each pair of shaft holes 2111 corresponds to the pair of posts 221 of a corresponding vane 22. Each of the first sidewalls 211 includes a plurality of stopper portions 2112 corresponding to the plurality of shaft holes 2111. When the plurality of vanes 22 rise under a force of airflow of the fans 11, the plurality of stopper portions 2112 prevent the vanes 22 from overturning and keep the plurality of vanes 22 lifted.

In assembly of the damper module 20, the pair of posts 221 of each of the plurality of vanes 22 extends into a corresponding pair of shaft holes 2111 of the frame 21. Each of the plurality of vanes 22 is configured to rotate relatively the frame 21. In the embodiment, the fan module 10 includes two fans 11, the damper module 20 correspondingly includes two groups of vanes 22, labeled as a first group of vanes 223 and a second group of vanes 224. FIG. 10 shows the first group of vanes 223 are lifted by a force of the airflow of a corresponding fan 11, and the second group of vanes 224 droop from gravitational weight of their own mass.

In the embodiment, each of the pair of second sidewalls 212 includes a plurality of hooks 2121. When the damper module 20 is mounted on the enclosure 200, the hooks 2121 latch into latching slots (not shown) in the enclosure 200 to secure the damper module 20 in the first end 310 of the air flue 300 of the enclosure 200.

Referring to FIG. 10, the damper module 20 further includes a cushion 23 pasted on the first sidewalls 211 and the second sidewalls 212 of the frame 21. When the damper module 20 is mounted on the enclosure 200, the enclosure 200 of the network device is shockproof and airproof due to the cushion 23 resisted between the frame 21 and the enclosure 200. In the embodiment, the cushion 23 is made of rubber. Alternatively, the cushion 23 may be made of plastic.

Referring to FIG. 1, during a process of assembling the heat dissipation assembly 100 in the enclosure 200, the damper module 20 is secured on the first end 310 of a corresponding air flue 300 of the enclosure 200. The fan module 10 is received in the corresponding air flue 300 with the first bracket 13 adjacent to the second end 320 of the air flue 300. The holder 12 is secured in the enclosure 200 and shields the second end 320 of the air flue 300. The vanes 22 of the damper module 20 droop from gravitational weight of their own mass when the power is cut off.

In the embodiment, the fans 11 includes bidirectional airflow. That is, the fans 11 includes two kinds of airflow directions, labeled as a first airflow direction D1, shown as FIG. 1, and a second airflow direction D2, shown as FIG. 17. The first airflow direction D1 indicates the airflow of the fans 11 flows from the outside of the enclosure 200 to the inside of the enclosure 200, and the second airflow direction D2 indicates the airflow of the fans 11 flows from the inside of the enclosure 200 to the outside of the enclosure 200, which is opposite to the first airflow direction D1.

In use, if the airflow direction of the fans 11 is in the first airflow direction D1, and all of the fans 11 function normally, the vanes 22 of the damper module 20 raise under the force of the airflow of the fans 11. As a result, the air flues 300 keep opening and the electronic parts 400 in the enclosure 200 are cooled by the air flow of the fans 11, shown as FIG. 1.

Figure 12:
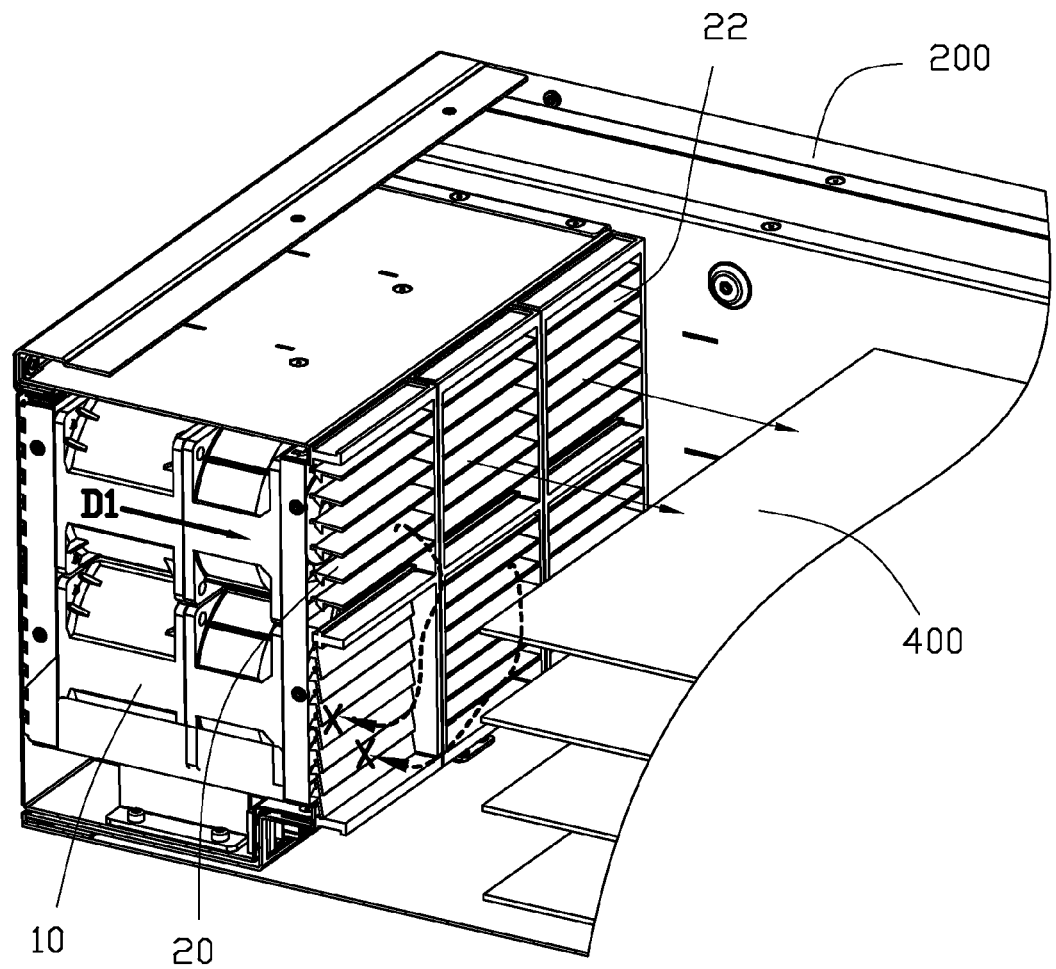
FIG. 12 is a schematic view of a heat dissipation state of the heat dissipation assembly, wherein one of the fans fails.

If one of the fans 11 or a pair of the fans 11 fails, the vanes 22 of the damper modules 20 corresponding to the failed fans 11 droop from gravitational weight of their own mass, due to without force of airflow of the failed fans 11. As a result, the air flues 300 corresponding to the failed fans 11 are closed by the drooped vanes 22, which prevents the airflow of the normal fans 11 flowing back to the air flues 300 corresponding to the failed fans 11, and improves efficiency of heat dissipation, shown as FIG. 12.

If the airflow directions of the fans 11 is required to change from the first airflow direction D1 to the second airflow direction D2. The position of the fan module 10 is reversed with the first bracket 13 supporting the vanes 22 of the damper module 20 to keep the air flues 300 open.

Figure 13:
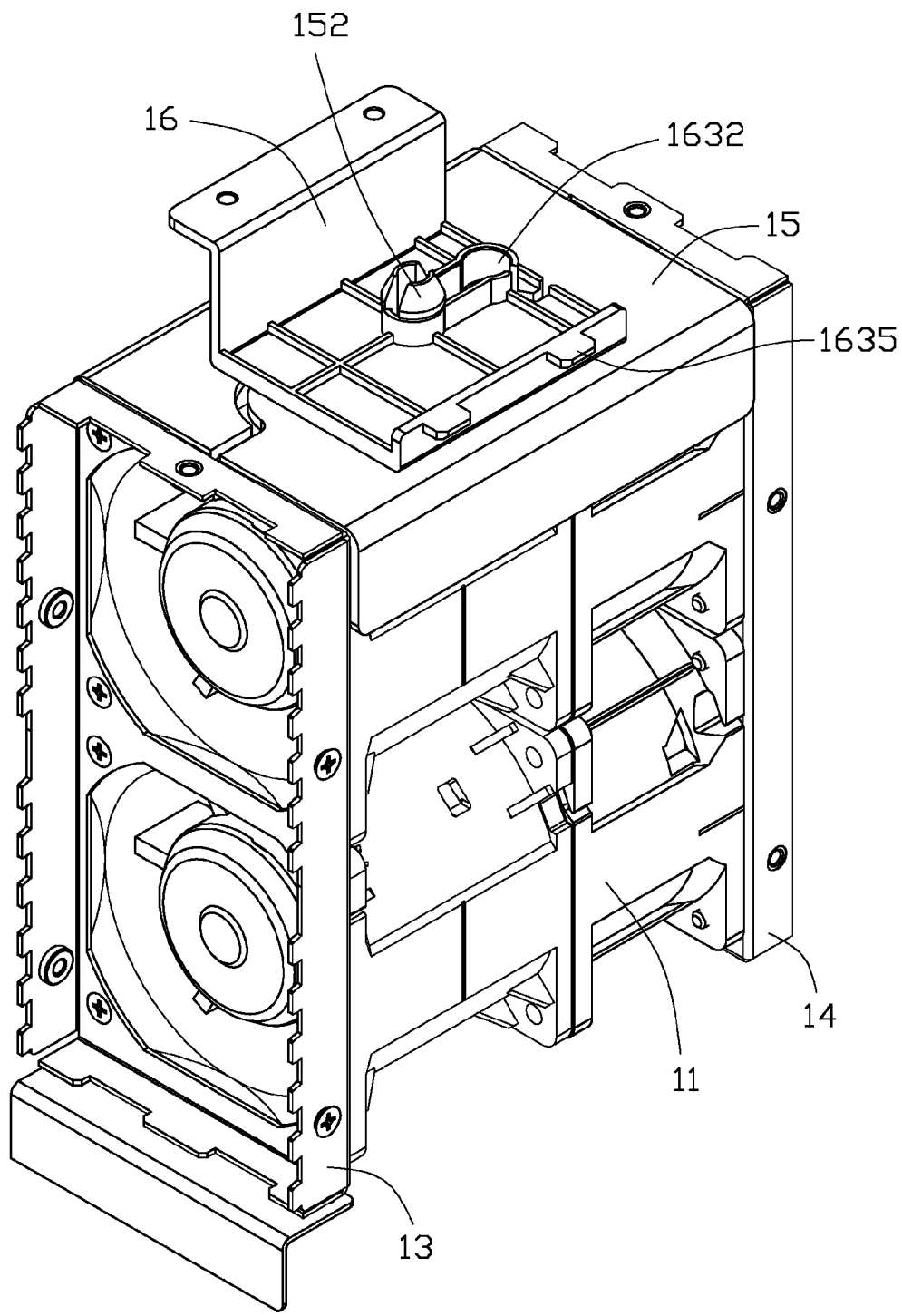
FIG. 13 is a schematic view of the second board combined with the first board of the fan module with a shaft of the first board received in a second receiving hole of the second board.
Figure 14:
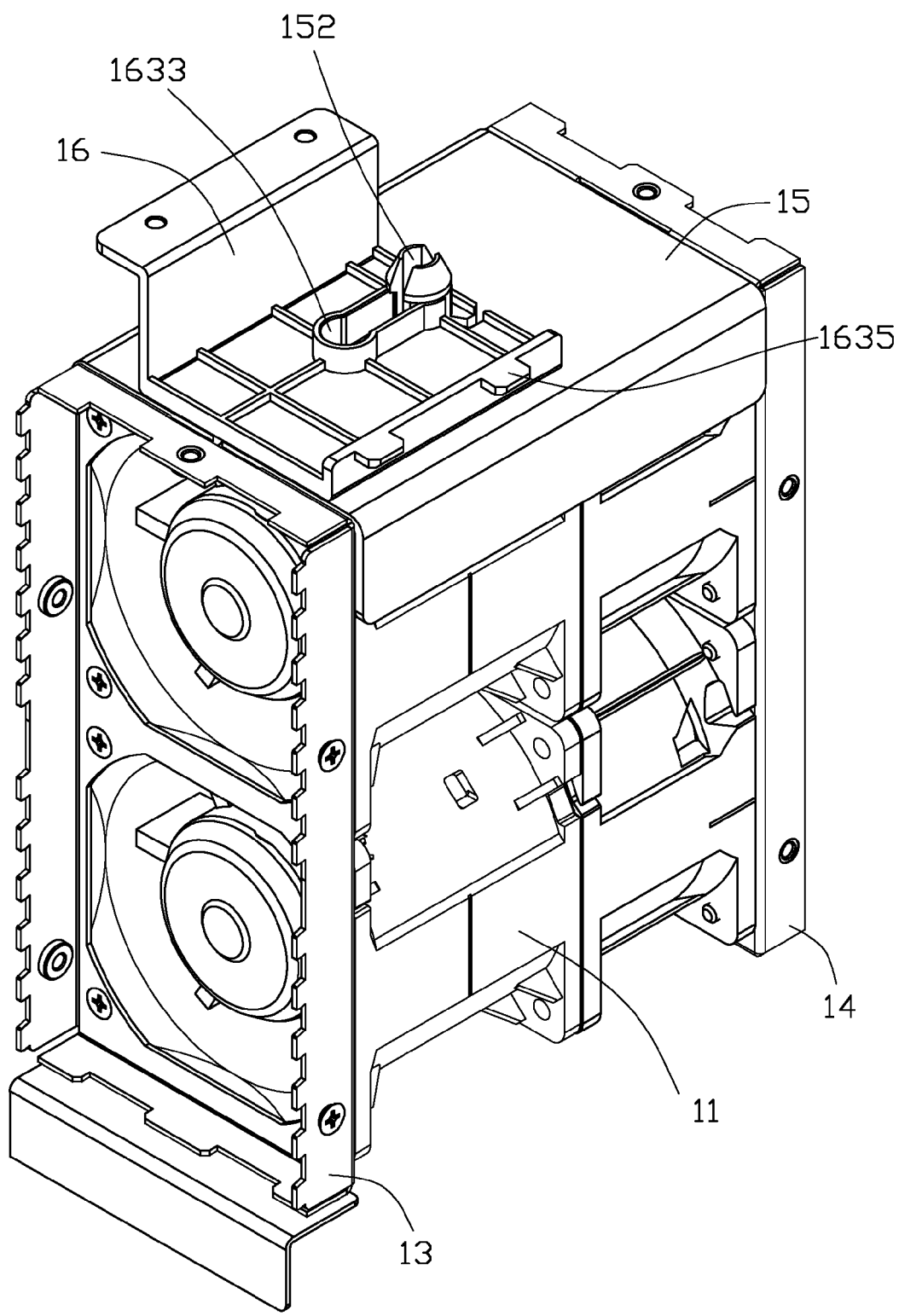
FIG. 14 is a schematic view of the second board combined with the first board of the fan module with the shaft of the first board received in a first receiving hole of the second board.
Figure 15:
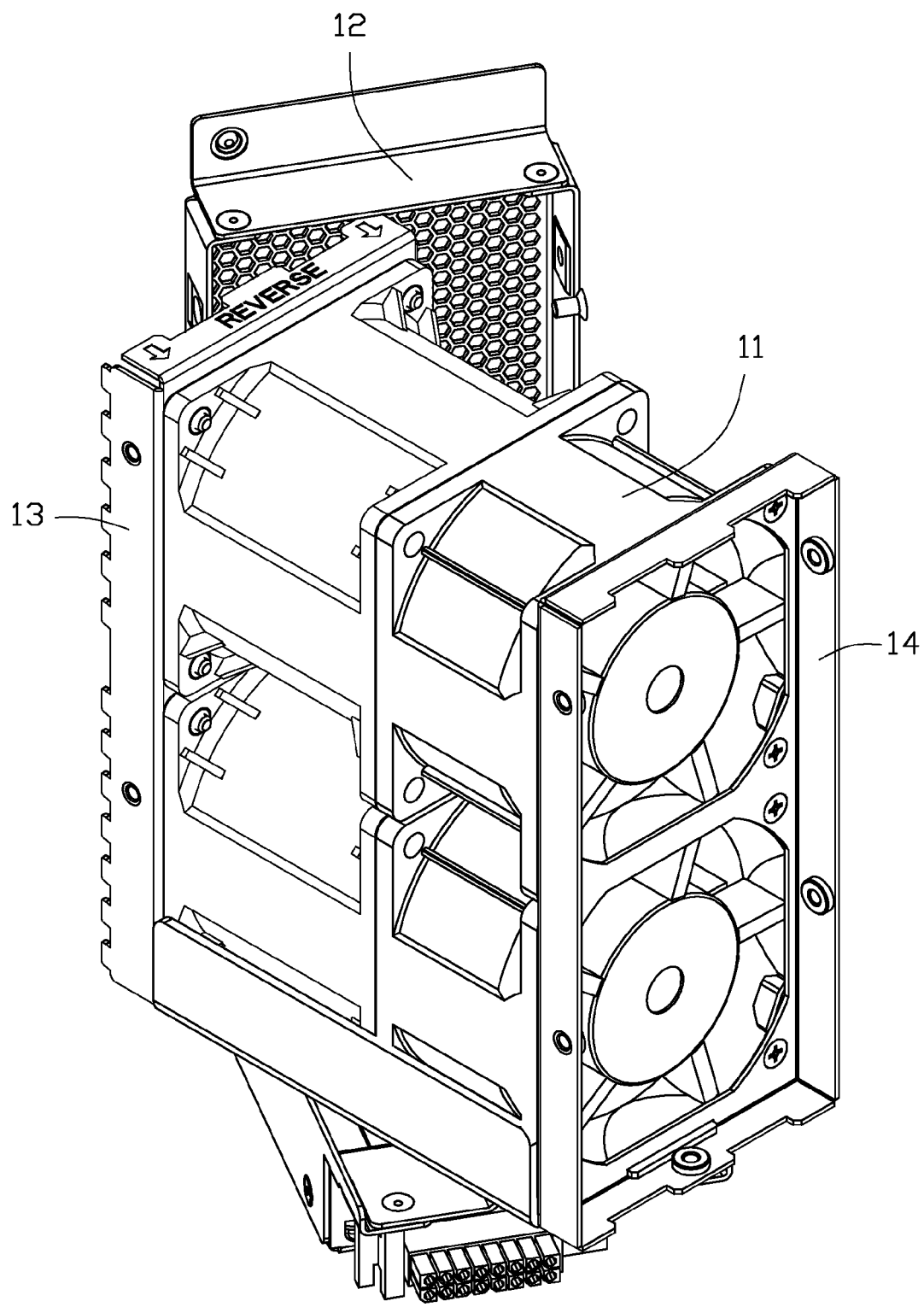
FIG. 15 is a schematic view of a state of the fans of the fan module rotating to reverse position of the fans.
Figure 16:
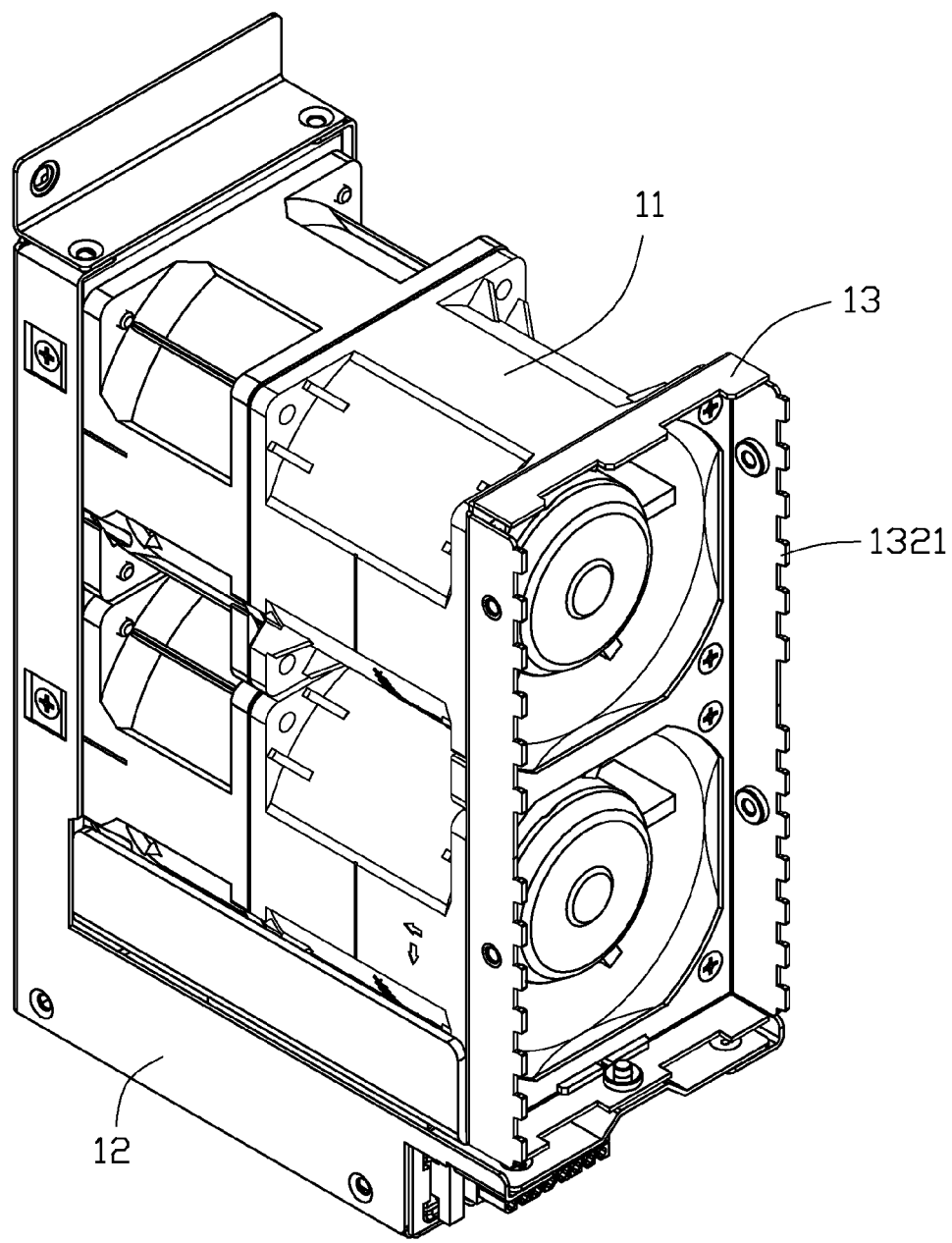
FIG. 16 is a schematic view of the fan module, wherein the fans of the fan module has reversed position relatively to the fan module of FIG. 3.

In detail, the fan module 10 is released from the enclosure 200 and taken out from the enclosure 200, and the first bracket 13 and the second bracket 14 are released from the holder 12. Subsequently, the fan 11 of the fan module 10 is drawn with the shaft 152 of the first board 15 sliding along the groove 1631 of the second board 16, the shaft 152 of the first board 15 is finally received in the first receiving hole 1632, shown as FIG. 13 and FIG. 14. The fan 11 is rotated to reverse position in the holder 12 with the first bracket 13 far away the sidewall 122 of the holder 12, shown as FIG. 15. The fan 11 is pushed with the shaft 152 of the first board 15 received in the second receiving hole 1633. The second bracket 14 is secured in the sidewall 122 of the holder 12, and the first bracket 13 is secured in the bottom 121 of the holder 12, shown as FIG. 15 and FIG. 16.

Figure 17:
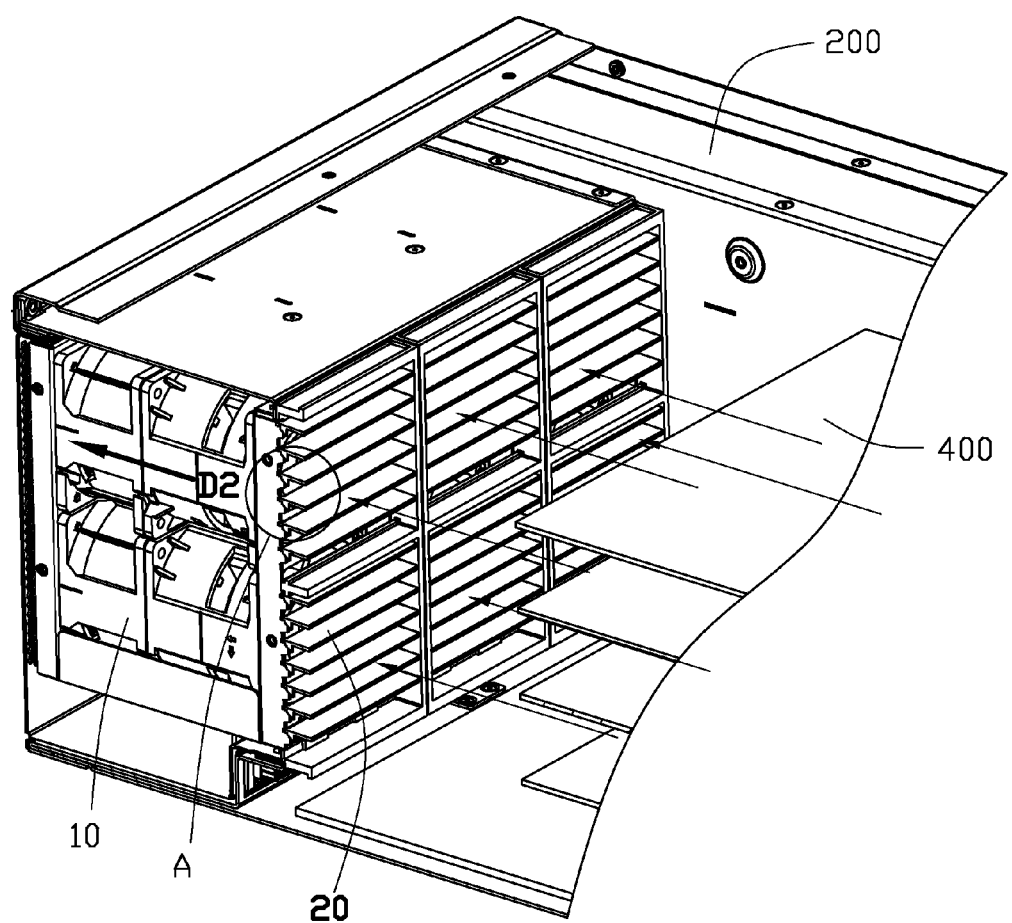
FIG. 17 is a schematic view of the fan module of FIG. 16, wherein the fan module is configured in the enclosure, and the airflow of the fans flows from the inside of the enclosure to the outside of the enclosure.
Figure 18:
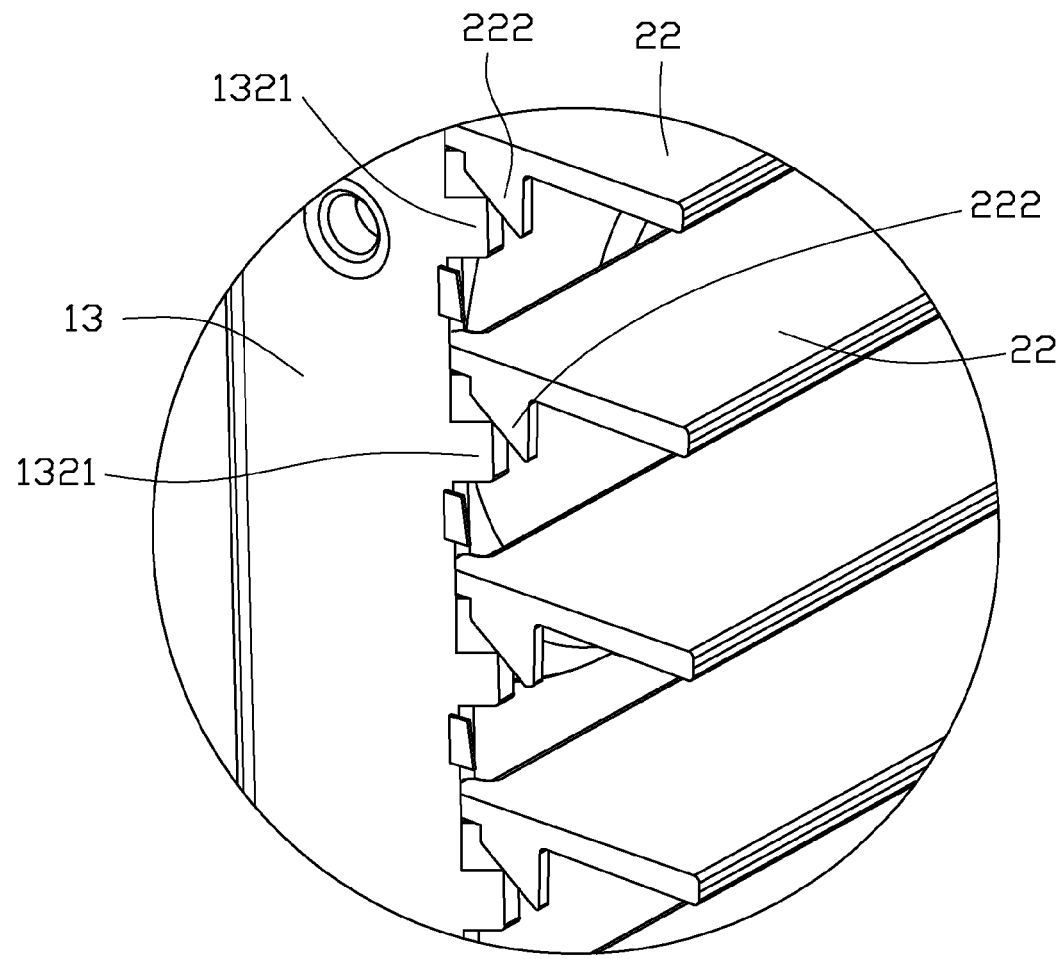
FIG. 18 is a sectional view enlarging a portion of the heat dissipation assembly of FIG. 17 for explaining a state of a first bracket of the fan module supporting the vanes of the damper module.

With reference to FIG. 17 and FIG. 18, the first bracket 13 of the reversed fan module 10 extends into the air flue 300 from the second end 320 of the air flue 300 to the first end 310 of the air flue 300, the teeth 1321 of the rims 132 of the first bracket 13 gradually extend into the frame 21 of the damper module 20 and contact the projections 222 of the corresponding vanes 22. The teeth 1321 of the first bracket 13 gradually pushes the projections 222 of the vanes 22 to move toward the inside of the enclosure 200 with the corresponding vanes 22 rotating relatively the frame 21 and gradually rising up. When the fan module 10 is completely received in the air flue 300, the teeth 1321 of the first bracket 13 support the projections 222 of the vanes 22. As a result, the vanes 22 always keep lifted under support of the teeth 1321 of the first bracket 13. So that, no matter the fans 11 works normal or fails, the air flues 300 keeps open to dissipate heat from the inside of the enclosure 200 to the outside of the enclosure 200.

The heat dissipation assembly 100 of the disclosure changes the airflow direction according to different heat dissipation requirements of the network device without change of the fans 11 and air flues 300 of the network device, which leads to simple structure of the enclosure 200 of the network device and low cost correspondingly. In addition, the modularity of the heat dissipation assembly 100 improves upgrading flexibility of the network device.

Although the features and elements of the present disclosure are described as embodiments in particular combinations, each feature or element can be used alone or in other various combinations within the principles of the present disclosure to the full extent indicated by the broad general meaning of the terms in which the appended claims are expressed.

What is claimed is:

1. A heat dissipation assembly mounted in an enclosure of a network device, the enclosure defining an air flue running through an inside of the enclosure and an outside of the enclosure, the heat dissipating assembly comprising:
   a fan module received in the air flue, and comprising a first bracket and a plurality of fans fixed with the first bracket; and
   a damper module secured in a first end of the air flue facing the inside of the enclosure, and the damper module comprising a frame and a plurality of vanes located in the frame;
   wherein the fan module comprises a first board secured in a bottom of the plurality of fans, and a second board secured in the enclosure, wherein the first board slides along the second board and is rotated relative to the second board to reverse positions of the plurality of fans in the air flue by an enternal external force;
   wherein when airflow of the plurality of fans flows from the outside of the enclosure to the inside of the enclosure, the plurality of vanes of the damper module are lifted by a force of the airflow, and when an airflow of the plurality of fans flows from the inside of the enclosure to the outside of the enclosure, the plurality of fans in the air flue are in a reversed position; the first bracket supporting the plurality of vanes of the damper module to keep the air flue open.

2. The heat dissipation assembly of claim 1, wherein the first board comprises a shaft, the second board defines a groove and a first receiving hole in communication with the groove, wherein the shaft slides along the groove and is received in the first receiving hole, and the shaft rotates in the first receiving hole to reverse positions of the plurality of fans in the air flue.

3. The heat dissipation assembly of claim 2, further comprising a holder comprising a base secured in the enclosure, wherein the second board is secured in the base of the holder.

4. The heat dissipation assembly of claim 3, wherein the first board defines a first slot, the shaft defines a through hole in communication with the first slot, wherein the second board defines a second slot in communication with the groove, and the base of the holder defines a positioning slot, wherein a connector of the plurality of fans is latched in the positioning slot, and a cable of the connector of the plurality of fans is latched into the first slot and passes through the through hole of the shaft and the second slot of the second board.

5. The heat dissipation assembly of claim 1, wherein the frame defines a plurality of pairs of shaft holes, and each of the plurality of vanes comprises a pair of posts located on two ends of the vane, wherein the pair of the posts of each of the plurality of vanes extend into a corresponding pair of shaft holes, and is rotated in the pair of shaft holes.

6. The heat dissipation assembly of claim 5, wherein the frame comprises a plurality of pairs of stopper portions corresponding to the plurality of pairs of shaft holes, wherein when the plurality of vanes are lifted, the plurality of stopper portions stop the plurality of vanes from overturning and keep the plurality of vanes lifted.

7. The heat dissipation assembly of claim 1, wherein the first bracket defines a plurality of hollows corresponding to the plurality of fans, and comprises a positioning surface fixed with the corresponding fans, and a plurality of teeth located on two opposite edges of the positioning surface to support the plurality of vanes.

8. The heat dissipation assembly of claim 7, wherein the first bracket comprises a pair of rims extending from two opposite edges of the positioning surface, and the plurality of teeth are located on the edges of the rims away the positioning surface.

9. The heat dissipation assembly of claim 7, wherein each of the plurality of vanes comprises a pair of projections extending from the vane, and each pair of teeth located on the two opposite edges of the pair of rims of the first bracket resist the projections of a corresponding vane to support the corresponding vane.

10. The heat dissipation assembly of claim 1, wherein the damper module comprises a cushion located between the frame and the enclosure.

11. A network device comprising an enclosure and a plurality of heat dissipation assemblies, the enclosure defining a plurality of air flues running through an inside of the enclosure and an outside of the enclosure, each of the plurality of heat dissipation assemblies corresponding to one of the plurality of the air flues, each heat dissipation assembly comprising:
 a fan module received in the corresponding air flue, and comprising a first bracket and a plurality of fans fixed with the first bracket; and
 a damper module secured in a first end of the corresponding air flue adjacent to the inside of the enclosure, and the damper module comprising a frame and a plurality of vanes located in the frame;
 wherein the fan module comprises a first board secured in a bottom of the plurality of fans, and a second board secured in the enclosure, wherein the first board slides along the second board and is rotated relative to the second board to reverse positions of the plurality of fans in the air flue by an enternal external force;
 wherein when airflow of the plurality of fans flows from the outside of the enclosure to the inside of the enclosure, the plurality of vanes of the damper module are lifted by a force of the airflow, when the airflow of the plurality of fans flows from the inside of the enclosure to the outside of the enclosure, the plurality of fans in the air flue are in reversed position with the first bracket supporting the plurality of vanes of the damper module to keep the air flue open.

12. The network device of claim 11, wherein the frame defines a plurality of pairs of shaft holes, and each of the plurality of vanes comprises a pair of posts located on two ends of the vane, and wherein the pair of the posts of each of the plurality of vanes extend into a corresponding pair of shaft holes, and is rotated in the pair of shaft holes.

13. The network device of claim 12, wherein the frame comprise a plurality of pairs of stopper portions corresponding to the plurality of pairs of shaft hole, and wherein when the plurality of vanes are lifted, the plurality of stopper portions stop the plurality of vanes from overturning and keep the plurality of vanes lifted.

14. The network device of claim 11, wherein the first bracket defines a plurality of hollows corresponding to the plurality of fans, and comprises a positioning surface fixed with the corresponding fans, and a plurality of teeth located on two opposite edges of the positioning surface to support the plurality of vanes.

15. The network device of claim 14, wherein the first bracket comprises a pair of rims extending from two opposite edges of the positioning surface, and the plurality of the teeth are located on the edges of the rims away the positioning surface.

16. The network device of claim 15, wherein each of the plurality of vanes comprises a pair of projections extending from the vane, and each pair of teeth located on the two opposite edges of the pair of rims of the first bracket resist the projections of a corresponding vane to support the corresponding vane.

17. The network device of claim 11, wherein the damper module of each of the plurality of the heat dissipation assemblies comprises a cushion located between the frame and enclosure.

* * * * *